United States Patent [19]

Ukaji et al.

[11] Patent Number: 5,773,953
[45] Date of Patent: Jun. 30, 1998

[54] SUBSTRATE TRANSFER SYSTEM

[75] Inventors: Takao Ukaji, Utsunomiya; Yukio Yamane, Tokyo, both of Japan

[73] Assignee: Canon Kabushiki Kaisha, Tokyo, Japan

[21] Appl. No.: 612,766

[22] Filed: Mar. 8, 1996

[30] Foreign Application Priority Data

Mar. 10, 1995 [JP] Japan ................................. 7-051118

[51] Int. Cl.⁶ ............................................. H01L 21/027
[52] U.S. Cl. ...................... 318/687; 74/471 XY; 414/751
[58] Field of Search ..................... 318/649, 687; 33/1 M; 74/471 XY; 269/73; 414/749, 750, 751

[56] References Cited

U.S. PATENT DOCUMENTS

| | | |
|---|---|---|
| 4,664,578 | 5/1987 | Kakehi . |
| 4,779,981 | 10/1988 | Ukaji ........................................ 356/237 |
| 4,818,169 | 4/1989 | Schram et al. . |
| 4,869,481 | 9/1989 | Yabu et al. ................................ 269/21 |
| 5,440,397 | 8/1995 | Ono et al. ................................ 356/401 |

*Primary Examiner*—Bentsu Ro
*Attorney, Agent, or Firm*—Fitzpatrick, Cella, Harper & Scinto

[57] ABSTRACT

A substrate transfer system includes a temporary support for temporarily supporting a substrate, a chuck for holding the substrate by attraction, a stage for supporting the chuck movably in a predetermined direction intersecting a substrate supporting face of the temporary support, a driving system for moving the stage in the predetermined direction, a measuring system for measuring a position of the stage with respect to the predetermined direction, a position servo system for controlling the driving system on the basis of the measurement by the measuring system to thereby servo control the position of the stage with respect to the predetermined direction, and a control system adapted to release the substrate attracting and holding operation of the chuck on the basis of a value corresponding to an amount of operation applied from the position servo system to the driving system. This substrate transfer system assures transfer of a substrate with small stress to the substrate, as well as high speed and high precision transfer of the substrate with a simplified θ alignment mechanism.

10 Claims, 3 Drawing Sheets

SUBSTRATE TRANSFER SYSTEM

FIELD OF THE INVENTION AND RELATED ART

This invention relates to a substrate transfer system for transferring a substrate to a stage mechanism, for example. The substrate transfer system of the present invention is suitably usable, in a semiconductor device manufacturing apparatus, such as an semiconductor integrated circuit manufacturing exposure apparatus, wherein a semiconductor substrate (wafer) is conveyed to a desired station where the substrate is to be processed.

Step-and-repeat or step-and-scan reduction projection type exposure apparatuses (called "steppers") have played a major role in the lithographic process, which is one of the manufacturing processes of semiconductor integrated circuits. In such a stepper, improvements in the performance of a wafer stage have been required to meet the requirement that the line width of a circuit be reduced to a submicron order. That is, both the need for improved speed and precision of the stage should be satisfied simultaneously. For the wafer stage mechanism, a simple structure and a compact mechanical arrangement are important to assure a high speed and high precision positioning operation.

In an alignment process wherein a pattern formed on a wafer, is to be positioned, the wafer having been approximately aligned with respect to a θ direction (rotational direction about a Z axis) on the basis of its outside peripheral shape, is transferred to a wafer chuck. Subsequently, a θ positional error is detected by using an alignment microscope and, then, θ drive is effected to correct the error. Thereafter, precise position measurement is performed.

As regards the wafer chuck, which should hold the bottom face of a wafer uniformly, it is difficult to provide the wafer chuck with a recess or notch. For this reason, in order to transfer a wafer to the wafer chuck, the wafer is once placed on a temporary support and then it is brought onto the wafer chuck.

Such a temporary support comprises, for example, three pins each having a bore at its free end for negative pressure attraction. For improved wafer stage precision, the components between the wafer chuck and a reference mirror of a laser interferometer, for measuring the position of the wafer stage with respect to X, Y and θ directions, should be reduced. In an arrangement wherein θ alignment is performed on the wafer chuck, a guide mechanism therefor has to be provided between the wafer chuck and the reference mirror. The provision of such a guide mechanism thus causes degradation of precision of alignment.

In order to avoid this, a θ drive mechanism may be provided at the wafer temporary support side by which θ alignment is to be performed, such that a driving mechanism between the wafer chuck and a plane mirror may be omitted.

In order to perform detection of the θ positional error, as well as performing θ drive upon the temporary support, the temporary support should be equipped with a vertical motion mechanism (Z-axis drive mechanism) for bringing the surface of a wafer within the range of the depth of focus of an alignment microscope. Also, to assure high speed positioning, the Z-axis drive mechanism should have a small mass and a simple structure. In an arrangement wherein the detection of θ positional error is effected on the wafer chuck and wherein θ drive is performed upon the temporary support, it is not necessary for the temporary support to have a Z-axis mechanism. However, there is a problem that, as compared with an arrangement wherein the alignment is performed upon the temporary support, the number of transfer operations between the wafer chuck and the temporary support is large.

Also, there is a possibility that positional error will occur during the transfer operation. Thus, for reducing positional error and producing a stable transfer operation, the negative pressure attraction at the temporary support and the negative pressure attraction at the wafer chuck should overlap with each other. The area of negative pressure attraction of the temporary support to a wafer is smaller than that of the wafer chuck. Thus, when the wafer is to be transferred to the wafer chuck from the temporary support, since the attracting force of the temporary support is sufficiently low, only a small stress is applied to the wafer, even if the wafer chuck is moved upwardly while the wafer is kept attracted to the temporary support by negative pressure.

However, when the wafer chuck is to be transferred from the wafer chuck, if the wafer chuck is moved downwardly while the wafer is kept attracted to the wafer chuck by negative pressure and the bottom face of the wafer is moved down beyond the top surface of the temporary support, a large stress will be applied to the wafer. If the negative pressure is released to avoid this, the supporting force is extinguished. This risks producing a positional deviation of the wafer upon the temporary support, producing θ positional error of the wafer.

SUMMARY OF THE INVENTION

It is an object of the present invention to provide a high speed and high precision substrate transfer system by which the transfer of a substrate, such as a wafer, is assured with a small stress to the substrate due to the alignment mechanism having a simple structure.

It is another object of the present invention to provide a device manufacturing method by which high precision and reduced cost device manufacture is assured.

In accordance with an aspect of the present invention, there is provided a substrate transfer system, comprising: a temporary support for temporarily supporting a substrate; a chuck for holding the substrate by attraction; a stage for supporting the chuck movably in a predetermined direction intersecting a substrate supporting face of the temporary support; driving means for moving the stage in the predetermined direction; measuring means for measuring a position of the stage with respect to the predetermined direction; position servo means for controlling the driving means on the basis of the measurement by the measuring means to thereby servo control the position of the stage with respect to the predetermined direction; and control means adapted to release the substrate attracting and holding operation of the chuck on the basis of a value corresponding to an amount of operation applied from the position servo means to the driving means.

The driving means may comprise at least one linear motor, and the amount of operation may be determined by a motor coil real current to the driving means. The control means may be adapted to detect an over-current of the motor coil real current, with respect to a predetermined value. The system may further comprise limiting means for limiting a current to the motor coil of the driving means. Also, the system may further comprise processing means for processing the substrate held by the chuck. The processing means may comprise means for projecting light to the substrate. The substrate may comprise a semiconductor substrate.

In accordance with another aspect of the present invention, there is provided a device manufacturing method for manufacturing a device by use of a substrate transfer system such as described above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 1:
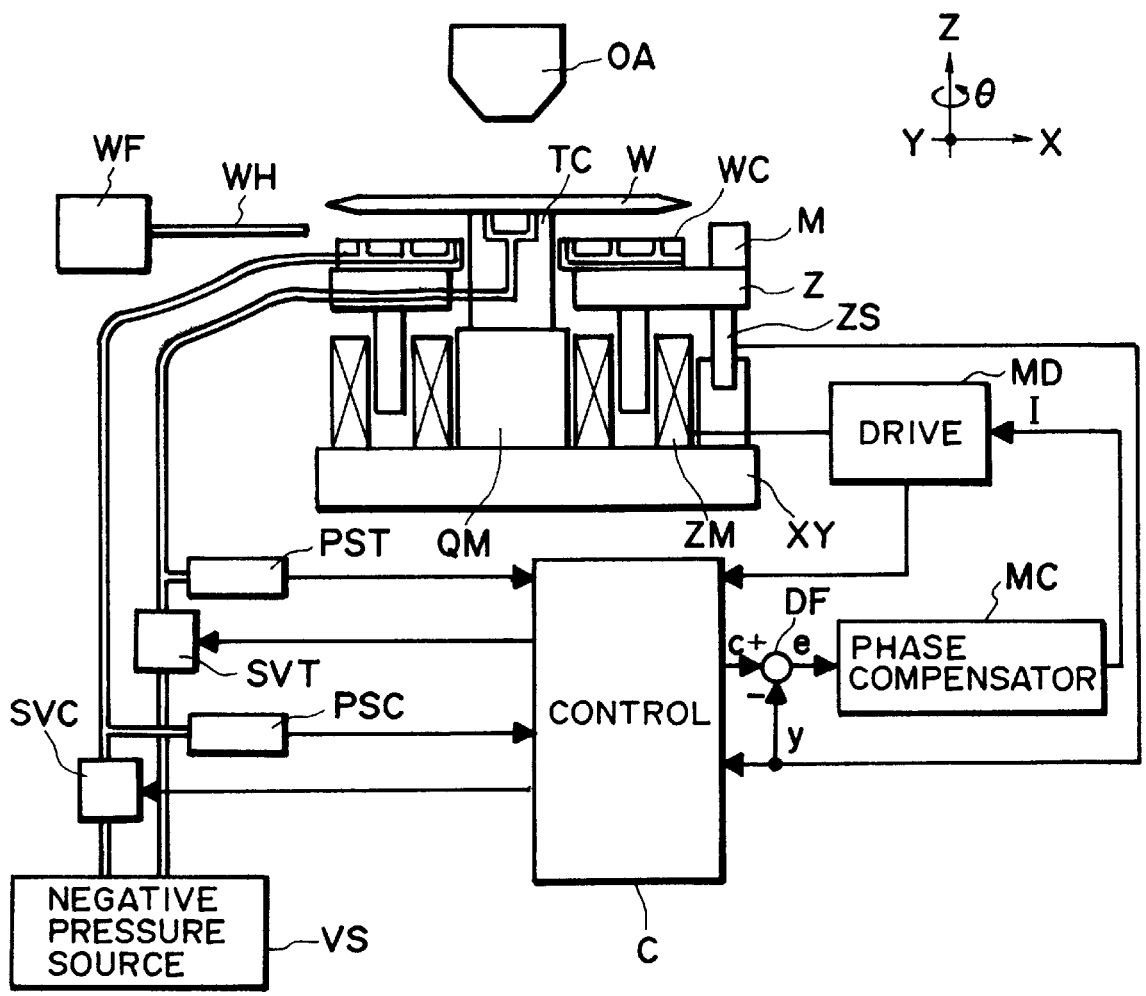
FIG. 1 is a schematic and diagrammatic view of a substrate transfer system according to an embodiment of the present invention.

FIG. 1 is a schematic and diagrammatic view for explaining details of a substrate transfer system according to an embodiment of the present invention. Denoted in this drawing at W is a substrate, such as a semiconductor wafer, which is the subject of an alignment operation. Hereinafter, this substrate is referred to as a "wafer". Denoted at WC is a wafer chuck for holding, by attraction, the wafer W so as to keep its flatness. Denoted at WH is a wafer hand which is operable to perform alignment of the wafer W on the basis of its outside peripheral shape and then to bring the wafer to place it upon a temporary support TC. The temporary support TC is operable to support the wafer W temporarily while keeping the wafer W and the wafer chuck WC spaced away from each other at least by a spacing corresponding to the thickness of the wafer hand WH.

Denoted at WF is a wafer feeder for driving the wafer hand WH so as to place the outside periphery of the wafer W at a desired position. Denoted at OA is a microscope for observing an alignment mark or marks of the wafer W to measure any positional error of it. Denoted at XY is an X-Y stage which is adapted to perform two-dimensional motion along horizontal directions (X and Y directions). Denoted at Z is a top plate (Z stage) which is movable upwardly and downwardly (Z direction), relative to the X-Y stage. Denoted at ZM are linear motors (driving means) which are mounted on the X-Y stage XY and which are adapted to move the top plate Z upwardly or downwardly along the Z direction. Denoted at ZS is a displacement sensor means (measuring means) for measuring displacement of the top plate Z in the vertical direction.

Denoted at MD is a motor driver (driver means) for controlling a drive current to the motor ZM. Denoted at DF is a differential circuit means for detecting a difference (e) between a target value (c) as outputted from controller means C and a current value (y) as outputted from the displacement sensor ZS. Denoted at MC is a phase compensator means which is connected to the motor driver MD and which is adapted to transform the difference (e) as calculated by the differential circuit means DF into an operational amount (I). These components function to provide position servo means. On the basis of the operational amount (I), the motor driver MD actuates the motor ZM.

Denoted at M is a mirror mounted on the top plate Z. This mirror M functions as a measurement reference for the measurement of displacement of the X-Y stage XY. Laser light from a laser interferometer distance measuring system (not shown) is projected on the mirror M, for measurement of displacement of the X-Y stage XY in the X and/or Y direction. Denoted at QM is a rough-motion θ motor mounted on the X-Y stage XY, for rotationally moving the temporary support TC upon the X-Y stage XY in the θ direction.

Denoted at PST is a temporary support pressure sensor which is connected to the temporary support TC through a duct, for measuring an attracting pressure at the temporary support TC. Denoted at PSC is a wafer chuck pressure sensor, which is connected to the wafer chuck WC through a duct, for measuring an attracting pressure at the wafer chuck WC. Denoted at SVT is a pressure valve, which is disposed in a portion of a duct that connects the temporary support TC and a negative pressure source VS. This pressure valve SVT serves to switch the pressure at the temporary support TC, between atmospheric pressure and a negative pressure (attracting pressure). Denoted at SVC is another pressure valve, which is disposed in a portion of a duct that connects the wafer chuck WC and the negative pressure source VS. This pressure valve SVC serves to switch the pressure at the wafer chuck WC, between atmospheric pressure and a negative pressure (attracting pressure).

The controller means C is adapted to receive the attracting pressure of the temporary support TC (output of the temporary support pressure sensor PST), the attracting pressure of the wafer chuck WC (output of the wafer chuck pressure sensor PSC) and the motor drive current (i). Also, it is adapted to produce an output signal to the temporary support pressure valve SVT and an output signal to the wafer chuck pressure valve SVC.

The differential circuit means DF calculates a difference (e) on the basis of a measured value (y) as produced by the displacement sensor ZS and a target value (c) as outputted by the controller means C. The phase compensator means MC then transforms the difference (e) into a motor ZM drive current command signal (I), which is to be applied to the driver means MD. Generally, a PID control is used in this transformation wherein, as a current command signal, a value is taken, which value is obtainable by summing the results of multiplying, by respective coefficients, (1) the difference P between the displacement sensor ZS and its target value, (2) the quantity I as obtained by integrating the difference, and (3) the quantity D as obtained by differentiating the difference. With this arrangement, the level of the top plate Z (i.e. the position with respect to the Z direction) is servo-controlled at a desired position.

The controller (control means) C first operates to set a target value (c) so that the top face of the temporary support TC is placed sufficiently above the top face of the wafer chuck WC. Then, the wafer W having been approximately positioned in accordance with its outside peripheral shape by means of the wafer feeder WF, is placed on the wafer hand WH and is moved thereby onto the temporary support TC.

The controller means C then opens the temporary support pressure valve SVT to its negative pressure side, until the wafer W is placed on the temporary support TC. The wafer hand WH moves down in the Z direction at a sufficiently low speed so as not to produce a positional error. As the wafer hand moves, the bottom face of the wafer W arrives at the same level as the top face of the temporary support TC, and the wafer W is then supported by the temporary support TC. After the top face of the wafer hand WH moves down to the position where it is spaced from the bottom face of the wafer, the wafer hand WH is moved along the X-Y plane back to a position where it does not interfere with the wafer chuck WC. Simultaneously therewith, the controller means C operates to move the wafer stage XY along the X-Y plane to a position where the wafer chuck WC and the wafer hand WF do not interfere with each other.

Subsequently, the controller means C operates to gradually increase the target value (c) in accordance with a measure value (y) of the displacement sensor ZS, by which the top face of the wafer chuck WC is moved close to the bottom face of the wafer W. Then, the wafer chuck pressure valve SVC is switched to its negative pressure side. As the top plate Z is moved upward in the Z direction so that the top face of the wafer chuck WC goes above the bottom face of the wafer W held by the temporary support TC and after the measured value of the wafer chuck pressure sensor PSC reaches a predetermined pressure, the controller means C opens the temporary support pressure valve SVT to its atmospheric pressure side.

With this operation, the wafer W is removed from the temporary support TC by means of the wafer chuck WC, and it is then supported by the wafer chuck WC. During this operation, the wafer W is continuously attracted and supported by means of one of the wafer chuck WC and the temporary support WT. Thus, there does not occur a substantial positional deviation due to the wafer transfer operation.

The controller means C operates to set a target value (c) in accordance with a measured value of the displacement sensor ZS, so that the top face of the wafer W, as attracted by the wafer chuck WC through a negative pressure, is brought into the depth of focus of the microscope OA. After the surface of the wafer W is positioned within the depth of focus of the microscope OA, the controller means C operates to measure the positional deviation of two alignment marks of the wafer W through the microscope OA, whereby positional deviations of the wafer W in the X, Y and θ directions are determined.

Subsequently, the controller means C monitors the current level (i) so that, if it changes beyond a predetermined range, the controller means promptly opens the wafer chuck pressure valve SVC to its atmospheric pressure side. It is to be noted that the current level (i) to the motor ZM from the motor driver MD is substantially constant if a change in the target value (c), corresponding to the measured value of the displacement sensor ZS, is sufficiently slow.

After this, the controller means opens the temporary support pressure valve SVT to its negative pressure side, so that the target value (c) of the displacement sensor ZS is lowered slowly. As the bottom face of the wafer W contacts the top face of the temporary support TC, a small force is applied upwardly to the bottom face of the wafer W from the temporary support TC. This increases the difference (e) between the measured value (y) of the displacement sensor ZS and the target value (c) therefor.

At this time, the current command signal output (I) of the phase compensator means C changes in a direction to reduce the difference (e). By this, the motor current level (i) from the motor driver MD changes, so that the controller means C opens the wafer chuck pressure valve SVC to its atmospheric pressure side. Then, the controller means C lowers the target value (c) of the displacement sensor ZS to the position at which a clearance is produced between the bottom face of the wafer W and the top face of the wafer chuck WC.

The controller means C causes rotation of the rough θ motor QM to correct the positional error of the wafer W in the θ direction, as measured by the microscope OA. Then, in accordance with the sequential operations as described above, the wafer is transferred from the temporary support TC to the wafer chuck WC. Finally, while correcting the X-Y positional deviation of the wafer as measured by the microscope OA through the movement of the X-Y stage XY, the wafer W is moved and positioned by the X-Y stage XY to and at a position of pattern projection of a projection optical system (not shown) where a pattern of a reticle, for manufacture of semiconductor integrated circuits, is to be projected by exposure. Then, step-and-repeat pattern printing operation is performed to the wafer W.

With the process described above, the wafer W positioning and alignment is performed through the wafer W transfer operation in which substantially no stress is applied to the wafer W. Thus, a high speed and high precision stepper with a simplified θ alignment mechanism is provided.

While in the above-described embodiment the actuator for the Z-axis drive comprises at least one liner motor, a DC motor or motors may be used. Also, a predetermined current limitation level may be set to the controller means C so that it monitors whether a change in current level exceeds the limitation. Further, the system may be equipped with a limiting mechanism so that the quantity of change in current level (i) does not go beyond a predetermined range.

It is not a requisition that the phase compensator means MC or the differential circuit means DF is provided by hardware. They may be provided by software, within the controller means C or by an operational processor (DSP), for example. Further, while a holding mechanism using negative pressure attraction is used in the embodiment described above, substantially the same advantageous result is attainable when an attracting mechanism based on electrostatic attraction is used.

Embodiment 2

Next, an embodiment of a device manufacturing method which uses an exposure apparatus described above will be explained.

Figure 2:
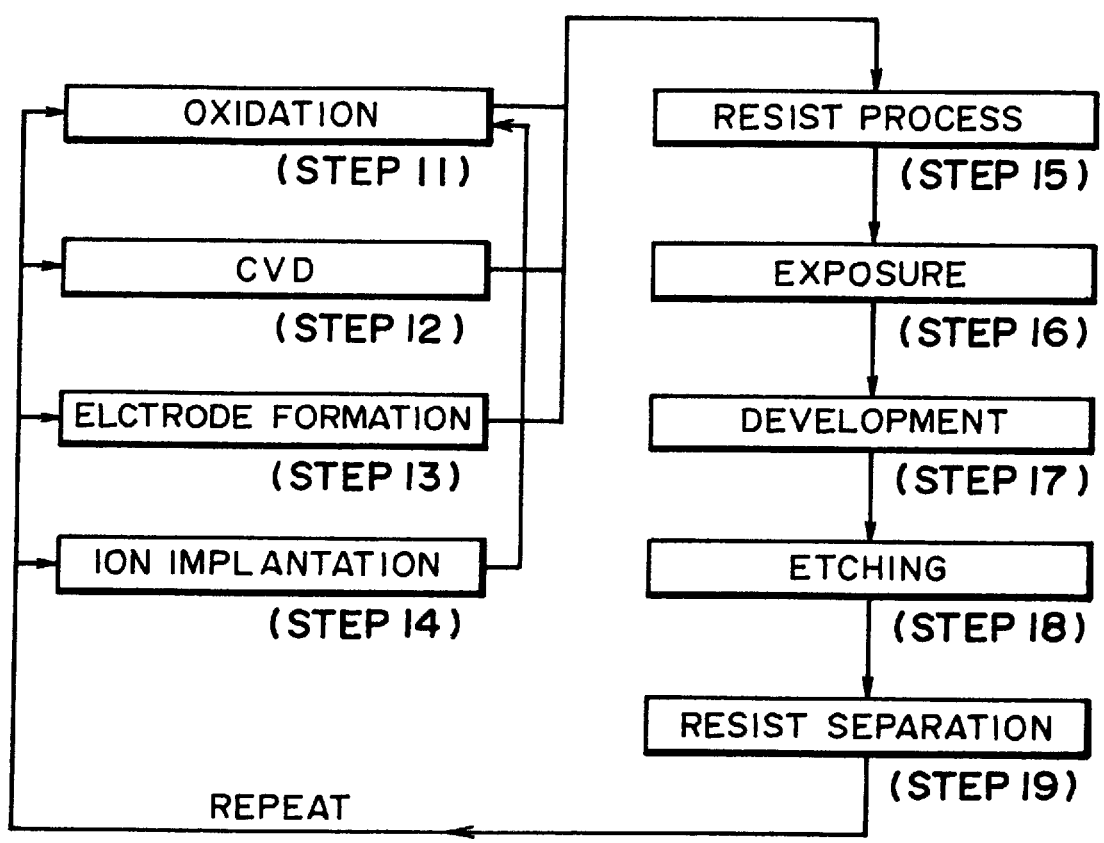
FIG. 2 is a flow chart of device manufacturing processes.

FIG. 2 is a flow chart of the sequence of manufacturing a microdevice, such as a semiconductor chip (e.g. IC or LSI), a liquid crystal panel, a CCD, a thin film magnetic head or a micro-machine, for example. Step 1 is a design process for designing the circuit of a semiconductor device. Step 2 is a process for manufacturing a mask on the basis of the circuit pattern design. Step 3 is a process for manufacturing a wafer by using a material, such as silicon.

Step 4 is a wafer process, which is called a pre-process wherein, by using the so prepared mask and wafer, circuits are practically formed on the wafer through lithography. Step 5 subsequent to this is an assembling step, which is called a post-process, wherein the wafer processed by step 4 is formed into semiconductor chips. This step includes assembling (dicing and bonding) and packaging (chip sealing). Step 6 is an inspection step wherein an operability check, a durability check, and so on, of the semiconductor devices produced by step 5, are carried out. With these processes, semiconductor devices are finished and they are shipped (step 7).

Figure 3:
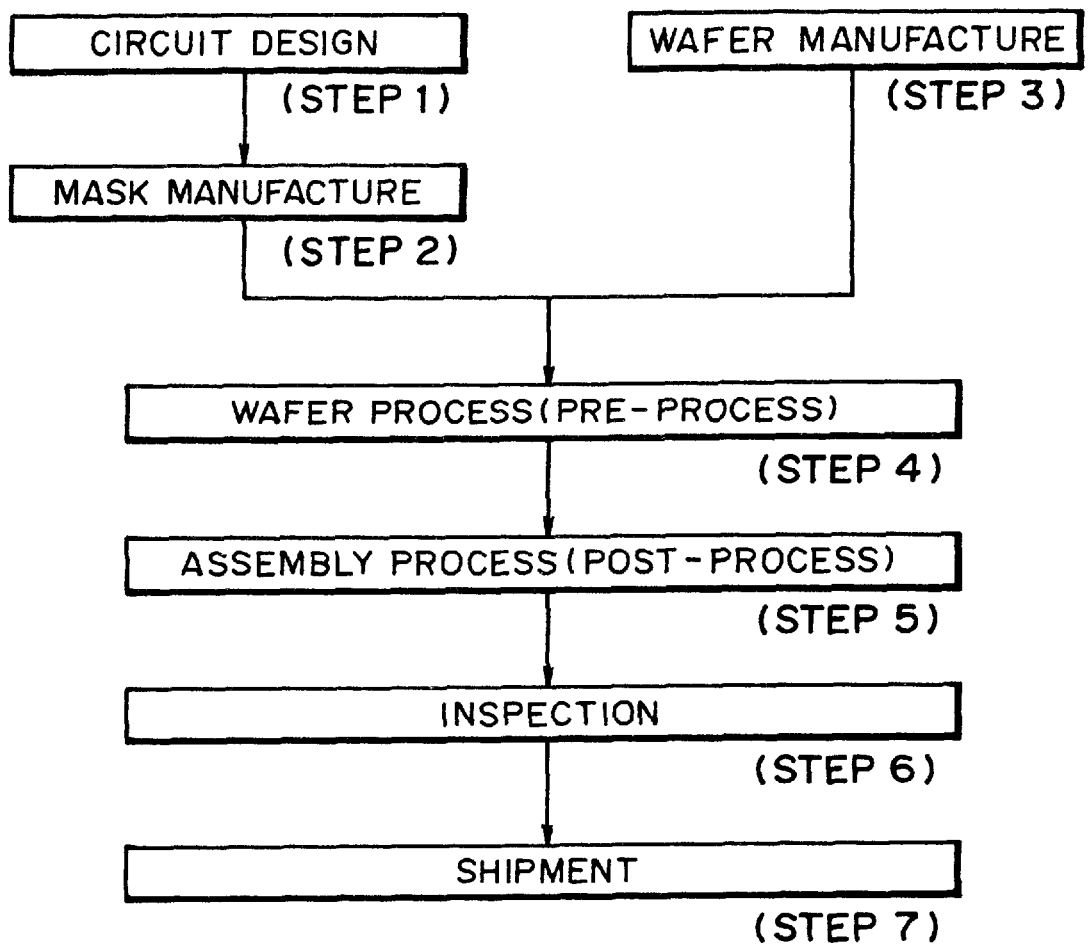
FIG. 3 is a flow chart for explaining details of a wafer process.

FIG. 3 is a flow chart showing the details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A substrate transfer system, comprising:
   a chuck having a holding surface for holding a substrate by attraction;
   a temporary support for temporarily supporting the substrate by attraction, said temporary support being provided within said chuck and being movable relative to said chuck;
   driving means for moving said chuck relative to said temporary support in a direction perpendicular to the holding surface;
   measuring means for measuring a positional relation of said chuck and said temporary support with respect to said perpendicular direction;
   servo means for controlling said driving means on the basis of the measurement by said measuring means; and
   control means for controlling the attraction of said chuck on the basis of a value corresponding to an operation amount of said servo means.

2. A system according to claim 1, wherein said driving means comprises at least one linear motor, and wherein the amount of operation is determined by a motor coil real current to said driving means.

3. A system according to claim 2, said control means is adapted to detect an over-current of the motor coil real current, with respect to a predetermined value.

4. A system according to claim 2, further comprising limiting means for limiting a current to the motor coil of said driving means.

5. A system according to claim 1, further comprising processing means for processing the substrate held by said chuck.

6. A system according to claim 5, wherein said processing means comprises means for projecting light to the substrate.

7. A system according to claim 5, wherein the substrate comprises a semiconductor substrate.

8. A system according to claim 1, further comprising means for rotating said temporary support relative to said chuck.

9. A system according to claim 1, wherein the attraction is provided by one of vacuum attraction and electrostatic attraction.

10. A device manufacturing method for manufacturing a device comprising the steps of:
    using a substrate transfer system to transfer a substrate to a chuck comprising the steps of:
       holding the substrate by attraction with the chuck;
       temporarily supporting the substrate by attraction with a temporary support, the temporary support being provided within the chuck and being movable relative to the chuck;
       moving the chuck relative to the temporary support in a direction perpendicular to the holding surface with driving means;
       measuring the positional relation of the chuck and the temporary support with respect to the perpendicular direction with measuring means;
       servo controlling the driving means on the basis of the measurement performed in said measuring step with servo means; and
    controlling the attraction of the chuck on the basis of a value corresponding to an operation amount of said servo means; and
    processing the substrate held by the chuck to produce the device.

* * * * *

UNITED STATES PATENT AND TRADEMARK OFFICE
CERTIFICATE OF CORRECTION

PATENT NO. : 5,773,953

DATED : June 30, 1998

INVENTOR(S) : Takao UKAJI, et al.

It is certified that error appears in the above-identified patent and that said Letters Patent is hereby corrected as shown below:

<u>COLUMN 1</u>:

Line 9, "an" should read --a--.

<u>COLUMN 7</u>:

Line 36, "2, said" should read --2, wherein said--.

Signed and Sealed this

Eighth Day of June, 1999

*Attest:*

Q. TODD DICKINSON

*Attesting Officer*  Acting Commissioner of Patents and Trademarks